(12) United States Patent
Seah (10) Patent No.: US 8,736,046 B2
(45) Date of Patent: May 27, 2014

(54) DUAL INTERLOCK HEATSINK ASSEMBLY FOR ENHANCED CAVITY PBGA PACKAGES, AND METHOD OF MANUFACTURE

(75) Inventor: Lee Hua Alvin Seah, Singapore (SG)

(73) Assignee: STMicroelectronics Asia Pacific PTE Ltd., Singapore (SG)

( * ) Notice: Subject to any disclaimer, the term of this patent is extended or adjusted under 35 U.S.C. 154(b) by 71 days.

(21) Appl. No.: 13/276,181

(22) Filed: Oct. 18, 2011

(65) Prior Publication Data

US 2013/0093085 A1    Apr. 18, 2013

(51) Int. Cl.
*H01L 23/10* (2006.01)

(52) U.S. Cl.
USPC .......................................................... 257/706

(58) Field of Classification Search
USPC ......................................... 257/276, 678–796
See application file for complete search history.

(56) References Cited

U.S. PATENT DOCUMENTS

| | | | |
|---|---|---|---|
| 6,919,631 B1 * | 7/2005 | Hoffman et al. | 257/707 |
| 7,071,550 B2 * | 7/2006 | Sato | 257/706 |
| 7,365,422 B2 * | 4/2008 | Liu et al. | 257/706 |
| 7,566,590 B2 * | 7/2009 | Zhong et al. | 438/119 |
| 2003/0020151 A1 * | 1/2003 | Chen et al. | 257/678 |

FOREIGN PATENT DOCUMENTS

| | | |
|---|---|---|
| KR | 2003-0023987 A | 3/2003 |
| KR | 10-2004-0077817 A | 9/2004 |

OTHER PUBLICATIONS

"BGA (Ball Grid Array)", National Semiconductor Application Note 1126, of Aug. 2003, 11 pages.

* cited by examiner

*Primary Examiner* — Matthew Reames
*Assistant Examiner* — Nicholas J Choi
(74) *Attorney, Agent, or Firm* — Seed IP Law Group PLLC (57) ABSTRACT

A semiconductor package is provided, including a laminate substrate with an aperture sized to receive a semiconductor die. Through-holes in the substrate are filled with a thermally conductive adhesive. A first heat spreader is attached to the by the adhesive, and a semiconductor die is positioned in the aperture with a back face in thermal contact with the heat spreader. Wire bonds couple the die to electrical traces on the substrate. A second heat spreader is attached by the adhesive to the substrate over the die, directly opposite the first heat spreader. A portion of the second heat spreader is encapsulated in molding compound. Openings in the second heat spreader admits molding compound to fill the space around the die between the heat spreaders. Heat is transmitted from the die to the first spreader, and thence, via the through-holes and conductive paste, to the second heat spreader.

13 Claims, 5 Drawing Sheets

DUAL INTERLOCK HEATSINK ASSEMBLY FOR ENHANCED CAVITY PBGA PACKAGES, AND METHOD OF MANUFACTURE

BACKGROUND OF THE INVENTION

1. Technical Field

This disclosure is related to a ball grid array package for a semiconductor device and a method for its manufacture, and in particular, to such a device including structures for thermal enhancement.

2. Description of the Related Art

As semiconductor packaging has evolved to accommodate the increasing complexity and miniaturization of semiconductor devices, a number of packaging structures have been developed to meet various requirements. One of these structures is the Plastic Ball Grid Array (PBGA), in which a plastic laminate substrate is formed with appropriate electrical traces and contact pads, and a semiconductor die is mounted on the substrate, with wire bonds connecting the die to the electrical traces. The die and wire bonds are overmolded, i.e., encapsulated by molding compound in an injection molding process, and a ball grid array is formed on the opposite side of the die for attachment to a PCB. Sometimes a cavity is formed in the top surface of the substrate, into which the die is positioned. For this reason, PBGA packages are generally defined as cavity-up packages.

Figure 1:
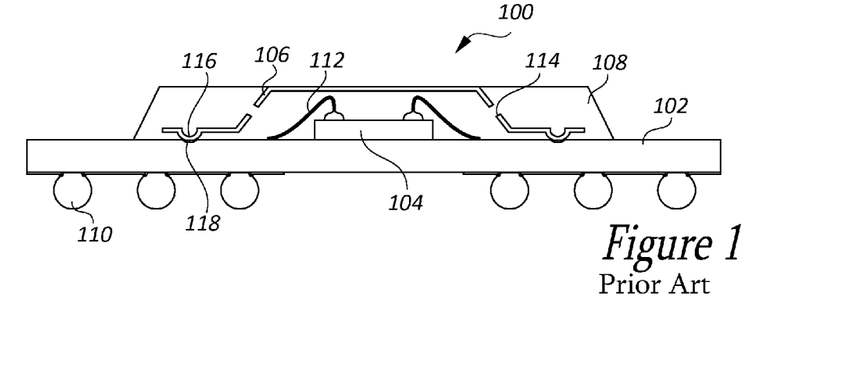
FIG. 1 is a diagrammatical view of a plastic ball grid array package according to known art.

A Thermally Enhanced PBGE (TEPBGA), also referred to as a Heatsink PBGA (HSPBGA), includes a heatsink positioned over the die. FIG. 1 shows a TEPBGA package 100 according to known art. The package 100 includes a laminate substrate 102 on which a semiconductor die 104 is mounted, and wire bonded (at 112) to the substrate. A heatsink 106 is positioned over the die 104 and attached by an appropriate adhesive. Registration bumps 116 on the heatsink 106 mate with registration cavities 118 on the substrate 102 to guide placement of the heatsink. The heatsink and die are overmolded, with slots 114 provided in the heatsink 106 to permit the molding compound 108 to pass into the interior of the heatsink and immobilize the wire bonds 112.

Another known variation is referred to as an Enhanced PBGA (EPBGA), in which an aperture is formed in the substrate, and the laminate is mounted on one side to a heatsink. The die is mounted to the heatsink inside the aperture and wire bonded to the substrate. The die and wire bonding are overmolded, and the ball grid array is formed on the side of the substrate opposite the heatsink.

Additional information relating to the devices described above, as well as other types of PBGA packages can be found in the National Semiconductor Application Note 1126, of August 2003, the entirety of which is incorporated herein by reference.

BRIEF SUMMARY

According to an embodiment, a semiconductor package includes a laminate substrate having an aperture sized to receive a semiconductor die. Through-holes in the substrate are filled with a thermally conductive paste. A first heat spreader is attached to one side of the substrate in contact with the paste, and a semiconductor die is placed in the aperture with a back face in thermal contact with the heat spreader. Wire bonds couple the die to electrical traces in the substrate. A second heat spreader is positioned over the die and the wire bonds directly opposite the first heat spreader and in thermal contact with the paste. A portion of the second heat spreader is encapsulated in molding compound. Openings in the second heat spreader admit molding compound to fill the space around the die between the heat spreaders. When electric power is applied to the die paths during normal operation heat is transmitted from the die to the first spreader. Heat is transferred via the through-holes and thermally conductive paste, from the first heat spreader to the second heat spreader and also from the die to the second heat spreader via the molding compound.

According to another embodiment, a semiconductor device package is provided, that comprises a substrate with a first aperture extending into the substrate, from a front face, less than an entire thickness of the substrate, and defining an inner face of the substrate lying in a plane between the front face and a back face of the substrate. A second aperture extends in the substrate from the inner face to the back face, and has lateral dimensions that are less than lateral dimensions of the first aperture. A plurality of heat transmission apertures is distributed around the second aperture and extend through the substrate from the inner face to the back face. Each of the heat transmission apertures includes a quantity of thermally conductive adhesive. A first heatsink is positioned on the back face over the second aperture and coupled to the substrate in physical contact with the quantity of thermally conductive material in each of the plurality of heat transmission apertures. A semiconductor die is positioned in the first second aperture and attached to the first heatsink. A second heatsink is positioned on the inner face of the substrate opposite the first heatsink, and also in physical contact with the quantity of thermally conductive material in each of the plurality of heat transmission apertures. The semiconductor die is enclosed between the first and second heatsinks.

A method of manufacturing a semiconductor device package is provided as described in detail below.

DETAILED DESCRIPTION

Figure 2:
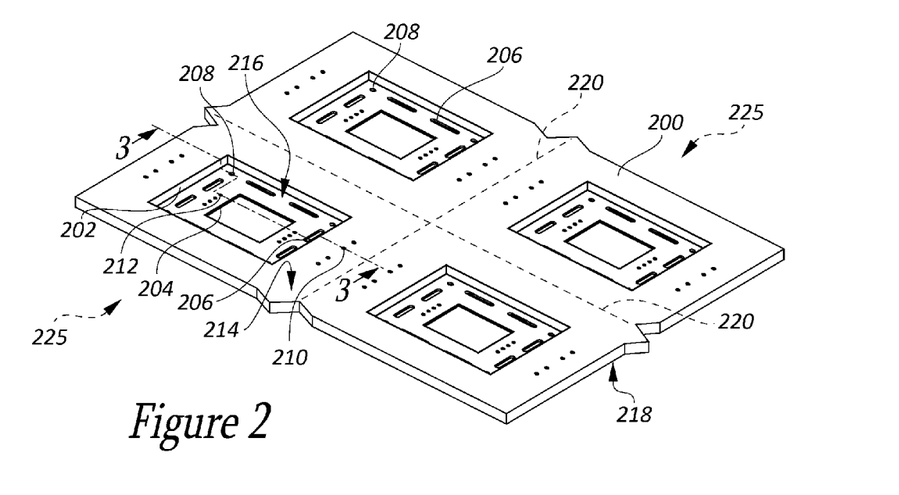
FIG. 2 is a perspective view of a portion of a laminate wafer prepared for use in the manufacture of semiconductor packages according to an embodiment.
Figure 3:
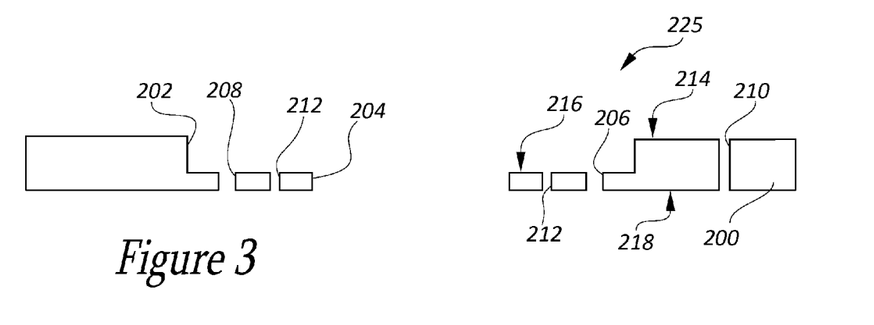
FIG. 3 is a side diagrammatical view of a package at the same stage of manufacture shown in FIG. 2, as viewed along line 3-3 of FIG. 2.

FIGS. 2-9 illustrate a semiconductor package 225, according to an embodiment, at respective stages of manufacture. FIG. 2 is a perspective view of a portion of a laminate wafer 200 prepared for use as a substrate in the manufacture of a plurality of semiconductor packages 225. Dotted lines 220 indicate kerf lines, where the wafer will eventually be cut into the separate packages 225. In subsequent figures, the process will be described and illustrated with respect to a single one of the packages, although it will be understood that according to a preferred method of manufacture, a plurality of packages are assembled on one laminate wafer substrate, which is separated into individual packages only after most or all of the manufacturing process is complete. FIG. 3 is a side diagrammatical view of a package 225 at the same stage of manufacture shown in FIG. 2, as viewed along line 3-3 of FIG. 2. It should be noted that line 3-3 is not straight, but changes direction along its length to better illustrate various elements.

As shown in FIGS. 2 and 3, the laminate substrate portion 200 of each package 225 includes a large cavity 202 that extends into a front face 214 of the substrate less than the full thickness of the laminate, defining an inner face 216. A small cavity 204 extends from the inner face 214 through the remaining thickness of the laminate substrate 200 to a back face 218. Thermal transfer apertures 206, registration apertures 208, and lower through-holes 212 are positioned at various locations around the small aperture 204 and extend from the inner face 216 through the remaining thickness of the laminate substrate 200 to the back face 218. Upper through-holes 210 extend through the substrate 200 from the front face 214 to the back face 218.

The cavities, apertures, and through-holes 202, 204, 206, 208, 210, and 212 can be formed in the material of the substrate 200 in any of a number of ways. For example, some or all of the various openings can be formed during a molding process by which the laminate substrate 200 itself is formed. Where the substrate is formed of a plurality of layers, the separate layers can be perforated at appropriate locations prior to being laminated. Other processes, such as mechanical milling, EDM milling, chemical etching, laser cutting, etc., can also be used. In short, any process capable of producing the desired size and shape impression can be used. Many such processes are well known in the art.

Figure 4:
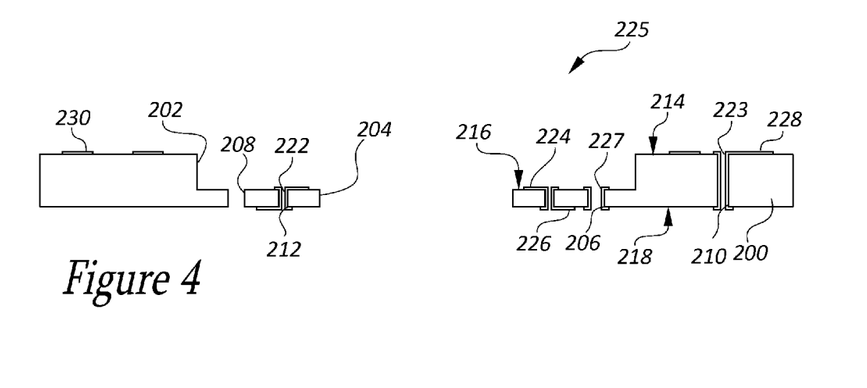
FIGS. 4, 6, 8, and 9 are side diagrammatical views of the package of FIG. 3 at respective stages of the manufacturing process, each taken along the same line 3-3 of FIG. 2.

Turning to FIG. 4, following formation of the substrate 200, electrically conductive material is deposited and defined to form various features on each of the front, inner and back faces 214, 216, 218. Through-holes 210 and 212 are plated to form plated through-holes 222, 223; through-plating 227 is formed in the thermal transfer apertures 206; electrically conductive traces 226 and 228 are formed on the back and front surfaces 218, 214, respectively; wire bond pads 224 are formed on the inner face 216; and ball grid pads 230 are formed on the front face 214. As discussed later with respect to FIG. 7, the conductive traces 226 place the plated through-holes 222 in electrical contact with respective plated through-holes 223, thereby electrically coupling the wire bond pads 224 with respective ball grid pads 230.

Figure 5:
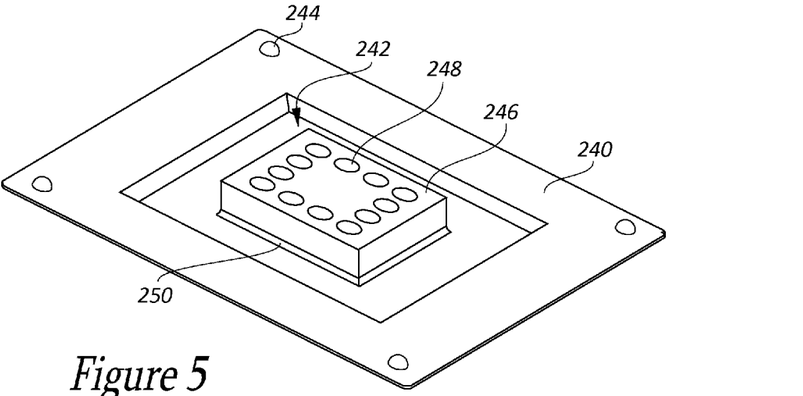
FIG. 5 is a perspective view of a heatsink element for use in the package of FIG. 3.

In a separate process, a first heatsink 240 is prepared, as shown in FIG. 5. The heatsink 240 has a depressed region 242 and a plurality of registration bumps 244. A semiconductor die 246 is attached in the depressed region 242 to the heatsink 240, by any appropriate means. Preferably, an adhesive 250 having a high degree of thermal conductivity is used to adhere a back side of the die 246 to the first heatsink 240. A plurality of contact pads 248 are provided on a front side of the die 246. In placing the die 246, optical detection systems, such as are well known in the art, can be used to detect the registration bumps 244 in order to guide a pick-and-place system in correctly positioning the die relative to the bumps. Furthermore, a plurality of heatsinks 240 can be formed in a single sheet of material that is separated into individual heatsinks after a semiconductor die is attached to each.

While the first heatsink 240 can be made of any suitably conductive material, including any of various ceramic materials, it is preferably made of a thermally conductive sheet metal, such as, e.g., copper or aluminum. This enables the formation of the heatsink 240 in an inexpensive stamping process in which the features of the heatsink are formed in a press using stamping dies. The same operation can also cut the material into individual heatsinks 240, or the cutting process can be performed later, as discussed above.

Figure 6:
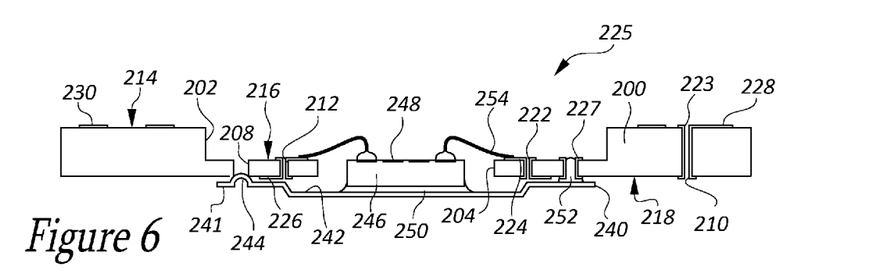
Figure 7:
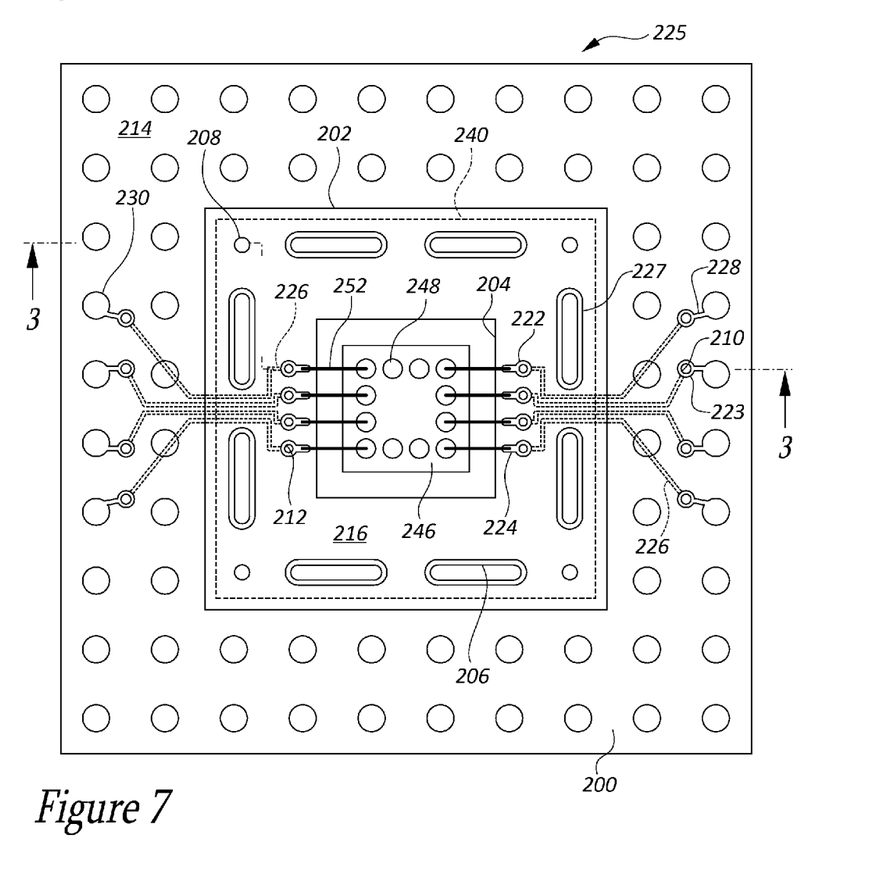
FIG. 7 is a plan view of the package of FIG. 3 at the same stage of manufacture shown in FIG. 6, and also includes the line 3-3, for reference.

FIG. 6 is a side diagrammatical view of the package 225 taken along the same line 3-3 of FIG. 2. FIG. 7 is a plan view of the package 225 at the same stage illustrated in the side view of FIG. 6, and also includes the line 3-3, for reference.

As shown in FIGS. 6 and 7, the first heatsink 240 is attached to the back face 218 of the substrate 200, with the attached semiconductor die 246 positioned so as to extend into, and preferably through the small cavity 204. The registration bumps 244 of the heatsink 240 have a spacing that corresponds to the spacing of the registration apertures 208 of the substrate 200 so that engagement of the registration apertures 208 by the registration bumps 244 ensures the correct positioning of the semiconductor die relative to the substrate 200 and the elements formed thereon. The size of the registration bumps 244, relative to the size of the registration apertures 208, controls a space between the rim 241 of the first heatsink 240 and the back face 218 of the substrate 200.

The first heatsink 240 is attached to the back face 218 of the substrate 200 using a thermally conductive adhesive 252. The adhesive 252 is placed on the back face 218 of the substrate over the thermal transfer apertures 206, and the heatsink 240 is then positioned on the substrate in contact with the adhesive. Pressure from the heatsink 240 as it is positioned, presses the adhesive 252 at least partially through the thermal transfer apertures 206. Once the heatsink 240 is positioned, the assembly is passed through a curing oven to at least partially cure the adhesive 252.

The adhesive 252 has a high thermal conductivity, but is not required to conduct electricity. However, the adhesive 252 can be electrically conductive if desired based on the electrical design. In one embodiment, it is also electrically conductive by the addition of a metallic component in the adhesive, which also increases its thermal conductivity. According to an embodiment, the adhesive 252 has a thermal conductivity of at least 1 k (k=watts of transmitted heat per meter-Kelvin).

Systems for accurately applying and controlling adhesive will not be described in detail, as they are well known in the art. For example, in a "dam and fill" operation, a bead of viscous encapsulate is deposited on a substrate around a die, then filled with a less viscous fluid to encapsulate the die and bonding wires. An operation similar to the "dam" operation can be used to apply adhesive over the thermal transfer apertures 206. Other dispensing processes are also known.

Once the semiconductor die 246 is properly positioned in the small cavity 204, wire-bond connections 254 are formed, electrically connecting the contact pads 248 of the die with the wire-bond pads 224. This completes an electrical connection of each of the contact pads 248 with a respective one of the ball grid pads 230 via wire-bond connections 254, wire bond pads 224, plated through-holes 222, electrical traces 226, plated through-holes 223, and electrical traces 228.

According to an alternate embodiment, the first heatsink 240 is first attached to the back face 218 of the substrate, and the semiconductor die is then placed in the small cavity 204 and attached to the first heatsink.

As shown in the plan view of FIG. 7, the thermal transfer apertures 206 are, according to the embodiment shown, elongate in shape, and separated by spaces through which the conductive traces 226 (shown in dotted lines) pass on the back face 218. The conductive traces 226 electrically couple the plated through-holes 222 with the plated through-holes 223.

Figure 8:
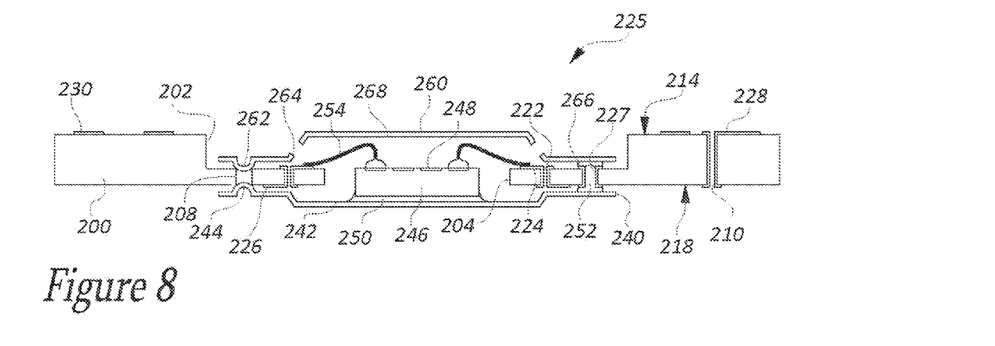

Turning to FIG. 8, an additional deposit of thermally conductive adhesive 266 is placed on the inner face 216 over the thermal transfer apertures 206, and a second heatsink 260 is positioned on the inner face opposite the first heatsink 240. The additional deposit of thermally conductive adhesive 266 makes physical contact with the adhesive 252 in the thermal transfer apertures 206. The second heatsink 260 includes a depressed region 268, to provide clearance for the wire bonds 254, and a plurality of registration bumps 262, to aid in placement and to control vertical spacing, as discussed above with reference to the registration bumps 244 of the first heatsink 240. In the embodiment shown, the registration apertures 208 extend through the substrate 200 from the inner surface 216 to the back surface 218, which enables the alignment of both the first and the second heatsinks 240, 260 relative to a common set of fiducials on the substrate. The second heatsink 260 also includes slots 264 to permit the passage of molding compound.

Figure 9:
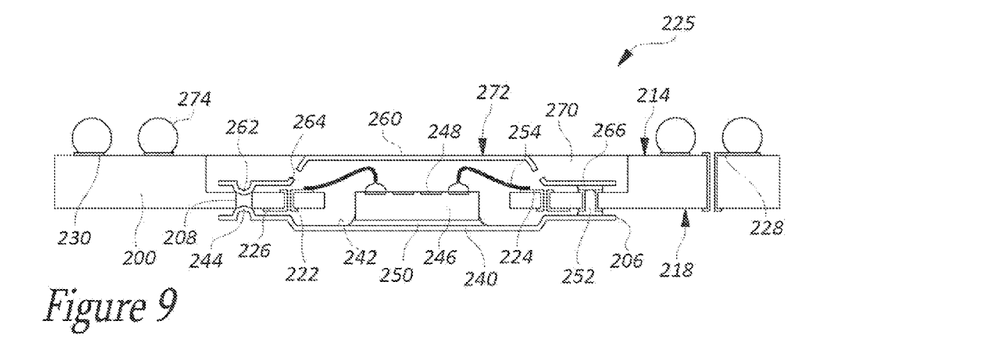

Referring now to FIG. 9, following placement of the second heatsink 260, the substrate 200 is subjected to a molding process in which the space defined by the large and small cavities and the first heatsink 240 is substantially filled with molding compound 270. The molding compound 270 is formulated to be capable of flowing through the slots 264 of the second heatsink 270 in order to fill the space enclosed by the first and second heatsinks 240, 270 and immobilize the wirebond connections 254. The front surface 272 of the second heatsink 270 is preferably exposed at a front side of the package 225. Solder balls 274 are placed on the ball grid pads 230 and reflowed to form a ball grid array. Finally, the substrate 200 is cut into individual packages 225.

The package 225 is attached for use to a printed circuit board (PCB) front face down, with an underfill layer between the front face 214 and the surface of the PCB, and between the front face 272 of the second heatsink 260 and the PCB. While in use, heat generated by operation of circuit components formed in the die 246 is transferred via the adhesive layer 250 to the first heatsink 240. Some of that heat is dissipated via active or passive cooling, or by convection to surrounding air. Another portion of the heat is transmitted via the thermally conductive adhesive 252, 266 and the plating 227 of the thermal transfer apertures 206 to the second heatsink 260. From there, heat is transferred to the PCB by conduction via the underfill layer.

According to the embodiment shown in FIGS. 8 and 9, the front surface 272 of the second heatsink 260 lies substantially coplanar with the front surface 214. According to another embodiment, second heatsink 260 is sized so that the front surface 272 of the second heatsink lies a selected distance outside a plane defined by the front surface 214 of the substrate 200. As noted above, the second heatsink 260 is thermally coupled, by the underfill layer, to the PCB on which the package 225 is mounted, for heat removal. However, while substances used in underfill materials, heat transmitting greases, and the like are typically formulated to be as thermally conductive as possible, certain metals, such as, e.g., copper and aluminum, are almost always more conductive. For example, where thermal grease typically has a conductivity of between 1 k and 3 k (k=watts of transmitted heat per meter-Kelvin), conductivity of pure aluminum is around 240 k and copper is about 400 k. Thus, where such an underfill material is used to transmit heat from, e.g., a copper heatsink in a semiconductor package to a copper heatsink embedded in a PCB, it is preferable to use as thin a layer of the material as possible, in order to minimize the relative resistance to heat transmission. Thus, with regard to the package 225 described above, based on factors such as volume of the solder bumps in the ball grid array, height of contact pads on the PCB, etc., it may be beneficial for the front surface of the second heatsink 260 to extend a selected distance beyond the front surface 214 of the package, in order to bring the front surface of the second heatsink into close contact with the surface of the PCB.

The thermal transfer apertures 206 can be significantly larger in size, with much greater heat transfer capacity, than the plated through-holes 222, which are configured primarily to transmit electrical signals. As compared to the prior art structures, the package 225 provides significantly more surface area for dissipation of waste heat. Additionally, the dual heatsink arrangement and thermal transfer apertures permit efficient transmission of heat to both sides of the package for dissipation.

It should be noted that the arrangement of the elements described with reference to the drawings is merely exemplary, and is not intended to represent a specific device, but is provided to illustrate features of the embodiments described. Many elements and process details whose principles are well understood in the art are omitted to simplify the drawings and descriptions. For example, an insulation layer can be deposited on the back surface 218 of the substrate 200 and patterned to cover and protect the electrical traces 226, and to prevent the possibility of short circuit if the adhesive 252 is electrically conductive and contacts some of the traces. Likewise, other structures and layers, such as, e.g., insulation, underbump metallization, passivation, and solder resist layers are omitted or not shown in detail, because their principles are well understood in the art, and their inclusion in the drawings would increase the complexity of the drawings and the necessary description. The circuit shown in the drawings, particularly FIG. 7, is not complete, showing only a small number of contact pads 248, wire bond pads 224, and electrical traces 226, 228. The omitted elements are not essential to an understanding of the principles disclosed herein, inasmuch as the design and layout of such features is a very common task in the art. Furthermore, the actual elements necessary for a given device are determined on the basis of the particular design and requirements of that design, which determination is within the abilities of a person having ordinary skill in the art.

Formation of through-plating, electrical traces, and contact pads can be accomplished using many different processes that are very well known in the art. According to one process, for example, a metallic layer is deposited on a substrate, a positive-acting photosensitive etch resist layer is deposited over the metallic layer, a photo mask is positioned over the resist layer, and the resist layer is exposed through the mask to a light source for a prescribed period, so that some portions of the resist layer are prevented from being exposed by the image of the mask. The resist layer is processed to remove the exposed portions of the layer, which in turn exposes the surface of the metallic layer at those locations. The substrate is processed in a chemical that dissolves the material of the metallic layer, so that the exposed portions of the metallic layer are removed. Lastly, the resist layer is removed, leaving portions of the metallic layer in the form of the image. This process is one of many different processes by which an feature or layer can be formed, and in many cases, the selection of one process over another is merely a design choice, where any of several processes would be satisfactory. Because such processes are generally well known and understood, they are not described in detail where the choice of process is not material to the disclosure.

Figure 10:
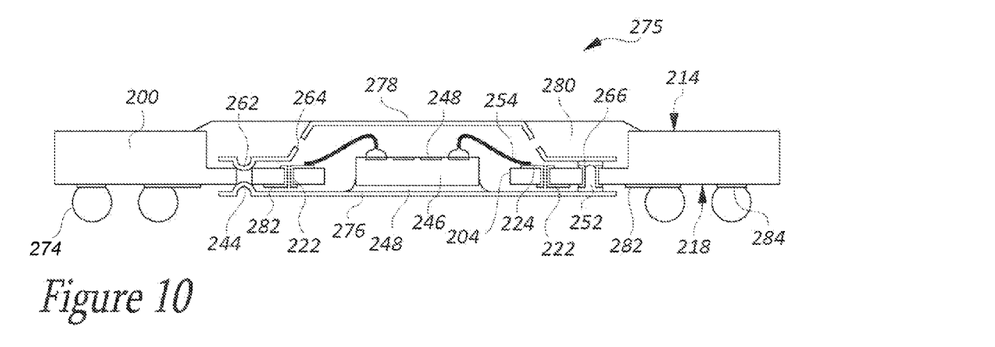
FIGS. 10 and 11 are side diagrammatical views of semiconductor packages according to respective further embodiments.

FIG. 10 shows a package 275 according to another embodiment, in which a first heatsink 276 is substantially flat, and electrical traces 282 place the plated through holes 222 in electrical contact with ball grid pads 284 formed on the back face 218, to which solder balls 274 are later attached. Dimensions of the embodiment of FIG. 10 being otherwise substantially equal to those of the embodiment of FIGS. 2-9, this results in the front side of the die 246 being higher than in the previous embodiment. Thus, a second heatsink 278 has a deeper depressed portion to accommodate the bonding wires 254, and the overmolded compound 280 has an increased height to accommodate the second heatsink. In the embodiment of FIG. 10, the package 275 is attached to the PCB top-side-up, and features such as the plated through-holes 223 are not required.

Figure 11:
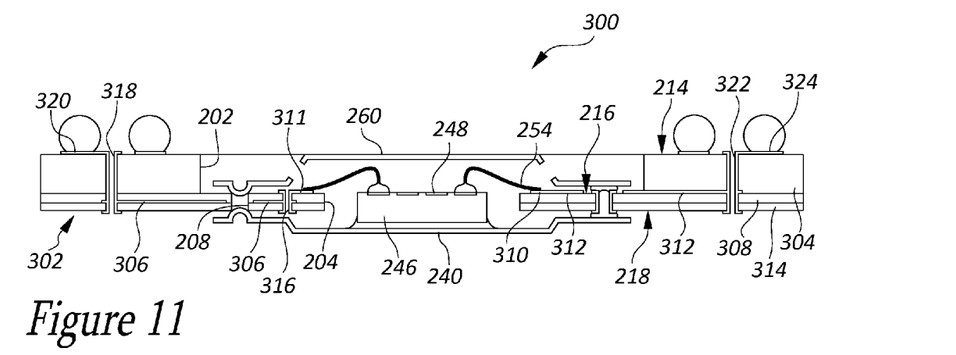

FIG. 11 shows a package 300 according to a further embodiment, in which the laminate substrate 302 is formed from a plurality of layers of material. In the exemplary embodiment of FIG. 11, at least three layers of material are laminated together to form the substrate 302. A first layer 314 has electrical traces 306 formed thereon; a second layer 308 is positioned over the first layer 314, and has wirebond pads 310 and electrical traces 312 formed thereon; and a relatively thick third layer 304 is positioned over the second layer 308. The front side of the third layer 304 defines the front surface 214 of the laminate 302, while the back side of the first layer 314 defines the back surface 218. A portion of the front side of the second layer 308 defines the inner surface 216.

The electrical traces 306 and 312 and wirebond pads 310 are formed on the front sides of the first and second layers 314, 308 before the layers are laminated together to form the substrate 302. The large cavity 202 is cut in the third layer 304, prior to lamination, to simplify formation of the cavity. Others of the various openings may also be preformed. After lamination, lower through-holes 316 are drilled and plated to electrically couple wirebond pads 311 with electrical traces 306, and upper through-holes 318 are drilled and plated to electrically couple electrical traces 306 with ball grid pads 320. Upper through-holes 322 are drilled and plated to electrically couple electrical traces 312 with ball grid pads 324. Apart from the distinctions described above, the elements and process steps employed on the manufacture of the package 300 are substantially the same as those described with reference to FIGS. 2-9.

Because electrical traces 306 and 312 are sandwiched between layers of the substrate 302, there are no traces on the lower surface 216 of the package 300, which eliminates the possibility of damage to the traces occurring during handing or transport. Because the traces 306 are in a different layer than traces 312, in embodiments where both layers of traces are used, they can cross each other or travel one over the other, which enables a higher density of traces and a more complex circuit. Traces 312 are formed on the same layer as the wirebonds 310, obviating the need for plated through-holes to connect them, which reduces the number of holes to be drilled and plated.

Terms such as aperture, hole, and cavity are used synonymously in the specification to refer to different elements. The use of such terms in the description does not limit the claims in any way. In particular, where these or similar terms are used in the claims, the terms are limited only by the language of the claims, not by the language of the specification, or to the elements to which they are applied in the specification.

Devices that are formed on semiconductor material substrates are generally formed on only one surface thereof, and actually occupy a very small part of the total thickness of the substrate. This surface is generally referred to as the active, front, or top, surface. Likewise, for the purposes of the present disclosure and claims, the terms front and back are used to establish an orientation with reference to a semiconductor wafer or die. For example, where a device includes a semiconductor die, reference to a front surface of some element of the device can be understood as referring to the surface of that element that would be uppermost if the device as a whole were oriented so that the active surface of the die was the uppermost part of the die. Of course, a back surface of an element is the surface that would be lowermost, given the same orientation of the device. The term lateral is used to refer to movement, directions or dimensions along lines or vectors that lie approximately perpendicular to a line extending from the front to the back of an element. Use of these terms to refer to an element of such a device is not to be construed as indicating an actual physical orientation of the element, the device, or the associated semiconductor component, and, where used in a claim, does not limit the claim except as explained above.

In describing the embodiments illustrated in the drawings, directional references, such as right, left, top, bottom, etc., may be used to refer to elements or movements as they are shown in the figures. Such terms are used to simplify the description and are not to be construed as limiting the claims in any way.

Ordinal numbers, e.g., first, second, third, etc., are used in the claims according to conventional claim practice, i.e., for the purpose of clearly distinguishing between claimed elements or features thereof. The use of such numbers does not suggest any other relationship, e.g., order of operation or relative position of such elements, nor does it exclude the possible combination of the listed elements into a single, multiple-function, structure or housing. Furthermore, ordinal numbers used in the claims have no specific correspondence to those used in the specification to refer to elements of disclosed embodiments on which those claims read.

The term coupled, as used in the claims, includes within its scope indirect coupling, such as when two elements are coupled with one or more intervening elements even where no intervening elements are recited.

The abstract of the present disclosure is provided as a brief outline of some of the principles of the invention according to one embodiment, and is not intended as a complete or definitive description of any embodiment thereof, nor should it be relied upon to define terms used in the specification or claims. The abstract does not limit the scope of the claims.

Elements of the various embodiments described above can be combined, and further modifications can be made, to provide further embodiments without deviating from the spirit and scope of the invention. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification, but should be construed to include all possible embodiments along with the full scope of equivalents to which such claims are entitled. Accordingly, the claims are not limited by the disclosure.

The invention claimed is:

1. A semiconductor device package, comprising:
   a substrate;
   a first aperture extending through the substrate;

a plurality of second apertures adjacent to the first aperture and extending through the substrate;

thermally conductive material positioned in the respective second apertures;

a first heatsink positioned adjacent to the first aperture and coupled to a first face of the substrate in physical contact with the thermally conductive material in the respective second apertures;

a semiconductor die coupled to the first heatsink and positioned at least partially within the first aperture; and a second heatsink positioned adjacent to the first aperture and coupled to the substrate, opposite the first heatsink, in physical contact with the thermally conductive material in the respective second apertures, the thermally conductive material being a different member from the second heatsink or the fist heatsink.

2. The package of claim 1 wherein the thermally conductive material completely fills each of the plurality of second apertures.

3. The package of claim 1 wherein the thermally conductive material is conductive paste.

4. The package of claim 1 wherein each of the plurality of second apertures has an elongated shape.

5. The package of claim 1 wherein the thermally conductive material has adhesive properties by which the first and second heatsinks are coupled to respective faces of the substrate.

6. A semiconductor device package, comprising:

a substrate;

a first aperture extending through the substrate, wherein the first aperture comprises:

a first portion extending into the substrate from a second face, opposite the first face, for less than an entire thickness of the substrate, an inner face of the first portion of the first aperture constituting a third face of the substrate, lying in a plane parallel to and between the first and second faces; and a second portion extending in the substrate from the third face to the first face, and having lateral dimensions that are less than lateral dimensions of the first portion;

a plurality of second apertures adjacent to the first aperture and extending through the substrate;

thermally conductive material positioned in the respective second apertures;

a first heatsink positioned adjacent to the first aperture and coupled to a first face of the substrate in physical contact with the thermally conductive material in the respective second apertures;

a semiconductor die coupled to the first heatsink and positioned at least partially within the first aperture; and a second heatsink positioned adjacent to the first aperture and coupled to the substrate, opposite the first heatsink, in physical contact with the thermally conductive material in the respective second apertures.

7. The package of claim 6 wherein:

the semiconductor die is positioned within the second portion of the first aperture;

the second heatsink is coupled to the third face; and each of the plurality of second apertures extends in the substrate from the third face to the first face.

8. The package of claim 6 wherein a face of the second heatsink abuts the second face of the substrate.

9. The package of claim 1, comprising:

a plurality of wirebond pads positioned on the substrate;

a plurality of wire bonds coupling each of a plurality of contact pads on a front face of the semiconductor die to respective ones of the plurality of wirebond pads;

a plurality of ball grid pads positioned on the substrate; and a plurality of electrical traces on the substrate, each coupling one of the plurality of wirebond pads to a respective one of the plurality of ball grid pads.

10. The package of claim 9 wherein the plurality of ball grid pads is positioned on a second face of the substrate, opposite the first face.

11. The package of claim 9 wherein the plurality of ball grid pads is positioned on the first face of the substrate.

12. A semiconductor device package, comprising:

a substrate;

a first aperture extending through the substrate;

a plurality of second apertures adjacent to the first aperture and extending through the substrate;

thermally conductive adhesive positioned in the respective second apertures;

a first heatsink positioned adjacent to the first aperture and coupled to a first face of the substrate in physical contact with the thermally conductive adhesive in the respective second apertures;

a semiconductor die coupled to the first heatsink and positioned at least partially within the first aperture; and a second heatsink positioned adjacent to the first aperture and coupled to the substrate, opposite the first heatsink, in physical contact with the thermally conductive adhesive in the respective second apertures.

13. The package of claim 12 wherein the thermally conductive adhesive includes a metallic component.

\* \* \* \* \*